United States Patent
Suzuki et al.

(10) Patent No.: US 12,125,709 B2
(45) Date of Patent: *Oct. 22, 2024

(54) METHOD AND DEVICE FOR ETCHING SILICON OXIDE

(71) Applicant: CENTRAL GLASS COMPANY, LIMITED, Yamaguchi (JP)

(72) Inventors: Shoi Suzuki, Yamaguchi (JP); Akifumi Yao, Yamaguchi (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/195,570

(22) Filed: May 10, 2023

(65) Prior Publication Data

US 2023/0274944 A1    Aug. 31, 2023

Related U.S. Application Data

(63) Continuation of application No. 17/272,742, filed as application No. PCT/JP2019/034427 on Sep. 2, 2019, now Pat. No. 11,715,641.

(30) Foreign Application Priority Data

Sep. 13, 2018  (JP) ................................. 2018-171060
Jul. 1, 2019   (JP) ................................. 2019-122643

(51) Int. Cl.
*H01L 21/311*    (2006.01)
*C09K 13/04*     (2006.01)
(Continued)

(52) U.S. Cl.
CPC ........ *H01L 21/31116* (2013.01); *C09K 13/04* (2013.01); *C09K 13/06* (2013.01);
(Continued)

(58) Field of Classification Search
None
See application file for complete search history.

(56) References Cited

U.S. PATENT DOCUMENTS 11,715,641 B2 *  8/2023  Suzuki ............. H01L 21/67069
                                                        438/706
2009/0275205 A1  11/2009  Kiehlbauch et al.
(Continued)

FOREIGN PATENT DOCUMENTS

JP    2-256235    10/1990
JP    4-137532     5/1992
(Continued)

OTHER PUBLICATIONS

International Search Report issued Nov. 26, 2019 in International (PCT) Application No. PCT/JP2019/034427.

*Primary Examiner* — Jiong-Ping Lu
(74) *Attorney, Agent, or Firm* — WENDEROTH, LIND & PONACK, L.L.P.

(57) ABSTRACT

The method of dry-etching silicon oxide of the present disclosure includes reacting silicon oxide with any one of the following (A) to (C): (A) a gaseous hydrogen fluoride and a gaseous organic amine compound, (B) a gaseous hydrogen fluoride salt of an organic amine compound, and (C) a gaseous hydrogen fluoride, a gaseous organic amine compound, and a gaseous hydrogen fluoride salt of an organic amine compound in a non-plasma state.

13 Claims, 1 Drawing Sheet

(51) Int. Cl.
  *C09K 13/06*    (2006.01)
  *C09K 13/08*    (2006.01)
  *H01L 21/02*    (2006.01)
  *H01L 21/302*   (2006.01)
  *H01L 21/306*   (2006.01)
  *H01L 21/67*    (2006.01)

(52) U.S. Cl.
  CPC ........ *C09K 13/08* (2013.01); *H01L 21/02164* (2013.01); *H01L 21/302* (2013.01); *H01L 21/30604* (2013.01); *H01L 21/31111* (2013.01); *H01L 21/67069* (2013.01); *H01L 21/67103* (2013.01)

(56) References Cited

U.S. PATENT DOCUMENTS

| | | |
|---|---|---|
| 2010/0216296 A1 | 8/2010 | Muraki et al. |
| 2012/0309999 A1 | 12/2012 | Kiehlbauch et al. |
| 2017/0316946 A1 | 11/2017 | Bajaj et al. |
| 2019/0244828 A1* | 8/2019 | Ma .................. H01L 21/311 |

FOREIGN PATENT DOCUMENTS

| | | | |
|---|---|---|---|
| JP | 6-181188 | 6/1994 | |
| JP | 8-81788 | 3/1996 | |
| JP | 9-509531 | 9/1997 | |
| JP | 2001-503571 | 3/2001 | |
| JP | 2007-180418 | 7/2007 | |
| JP | 2018-26566 | 2/2018 | |
| KR | 100870914 | * 11/2008 | ........... H01L 21/302 |
| WO | 94/27315 | 10/1994 | |
| WO | 98/43285 | 10/1998 | |
| WO | 2007/049510 | 5/2007 | |

\* cited by examiner

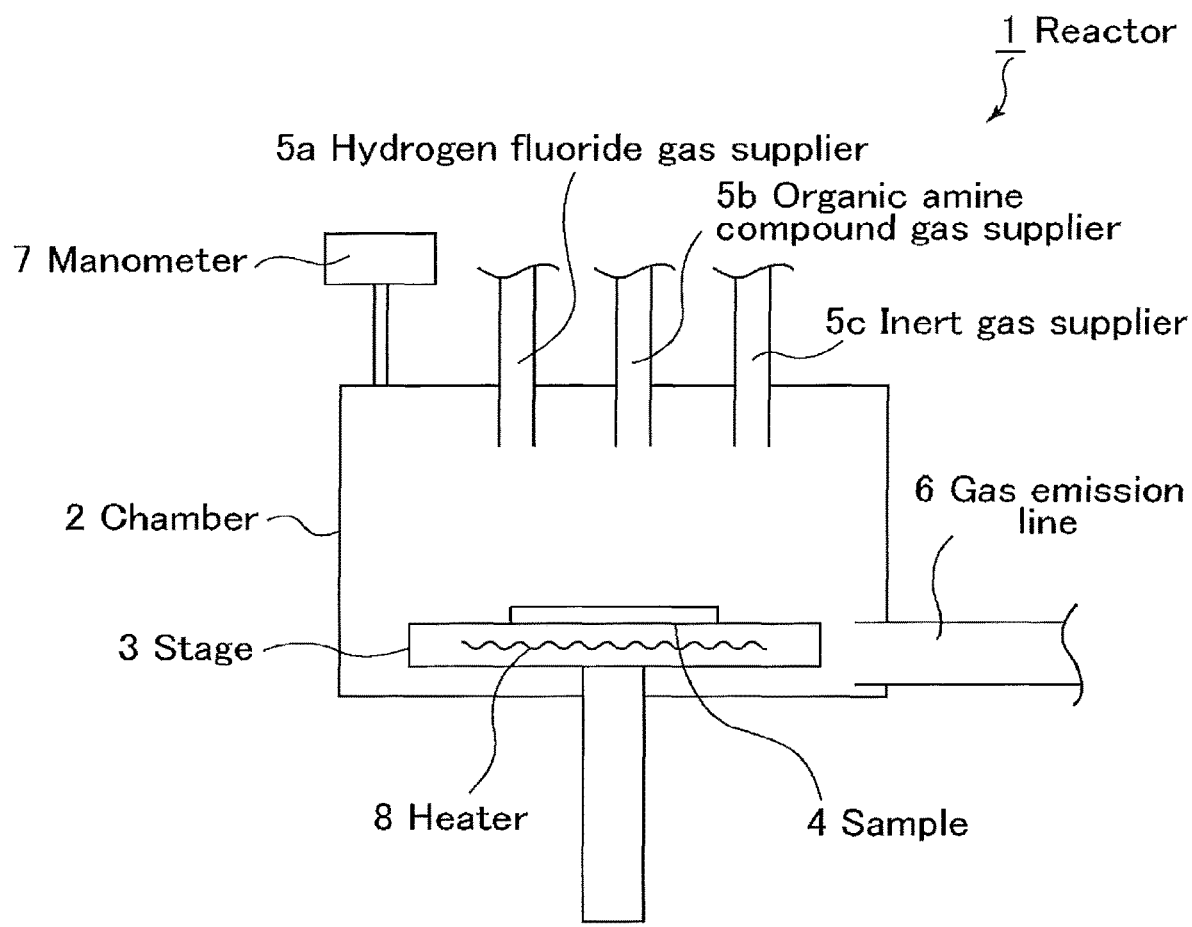

METHOD AND DEVICE FOR ETCHING SILICON OXIDE

TECHNICAL FIELD

The present disclosure relates to a method of dry-etching silicon oxide in a non-plasma state, and an etching apparatus used in the method.

BACKGROUND ART

Production of semiconductor devices includes etching of a silicon oxide film, such as a CVD oxide film, a thermal oxide film, or a natural oxide film, on a surface of a semiconductor wafer. The silicon oxide film is etched by wet etching with chemical liquids or plasma etching with reactive gas plasma.

In wet etching, chemical liquids often adversely affect parts other than etching targets. In plasma etching, wafers are liable to electric damage derived from plasma.

To overcome the issues, dry-etching without plasma has been tried. Some techniques of dry-etching $SiO_2$ without plasma are disclosed. For example, a hydrogen fluoride gas is used in combination with: water vapor in Patent Literature 1; gaseous methanol in Patent Literature 2; gaseous acetic acid in Patent Literature 3; and gaseous isopropyl alcohol in Patent Literature 4.

For fast $SiO_2$ etching, techniques using a gas mixture including a hydrogen fluoride gas and an ammonia gas are studied. For example, Patent Literature 5 discloses a two-step etching involving an AFS layer forming step (chemical oxide removal; COR treatment) and a heating step (post heat treatment; PHT treatment). In the AFS layer forming step, a gas mixture including HF gas and $NH_3$ gas is supplied to a surface of a silicon oxide film on a substrate so that the silicon oxide film chemically reacts with the gas mixture into ammonium fluorosilicate (AFS), thereby forming an AFS layer as a reaction product on a silicon layer of the substrate. In the heating step, the AFS layer is heated to be sublimated or thermally decomposed without supplying the gas mixture.

CITATION LIST

Patent Literature

Patent Literature 1: JP H6-181188 A
Patent Literature 2: JP H8-81788 A
Patent Literature 3: JP H9-509531 T
Patent Literature 4: JP 2001-503571 T
Patent Literature 5: JP 2007-180418 A (JP 4890025 B)

SUMMARY OF INVENTION

Technical Problem

Unfortunately, the $SiO_2$ etching speed is insufficient in the methods of Patent Literatures 1 to 4.

The method of Patent Literature 5 is also unsatisfactory because, if the COR treatment alone is performed, the AFS layer remains as a residue on the surface of the silicon oxide film. Additionally, in order to completely remove a thick AFS layer formed in the COR treatment by the PHT treatment, the layer needs to be heated at higher than 200° C. Heat damage of parts other than the silicon oxide film is concerned.

Furthermore, since the PHT treatment is conducted at a higher temperature than the COR treatment, a chamber needs to be heated or cooled every time the steps are switched, or the chamber may be replaced in each step, reducing productivity.

The present disclosure aims to provide a method of etching silicon oxide without plasma at a sufficient speed while generating no residue even at a low temperature of 200° C. or lower.

Solution to Problem

As a result of intensive studies, the present inventors found that silicon oxide reacts with HF and an organic amine compound as a base instead of $NH_3$, and that the reaction product sublimates at a much lower temperature than ammonium fluorosilicate and can be removed at a low temperature. Accordingly, the present disclosure was completed.

Specifically, the dry-etching method of the present disclosure includes reacting silicon oxide with any one of the following (A) to (C): (A) a gaseous hydrogen fluoride and a gaseous organic amine compound, (B) a gaseous hydrogen fluoride salt of an organic amine compound, and (C) a gaseous hydrogen fluoride, a gaseous organic amine compound, and a gaseous hydrogen fluoride salt of an organic amine compound in a non-plasma state.

Herein, etching in a plasma state refers to etching involving generating low-temperature gas plasma in a reactor by introducing a halogen gas or the like at a pressure of about 0.1 to 10 Torr into the reactor and applying a high-frequency power to an outer coil or a counter electrode, and etching silicon oxide or the like with a halogen-based active chemical generated in the reactor.

The etching method of the present disclosure involves reacting the above-mentioned gas in a non-plasma state, thereby dry-etching silicon oxide without generating the above-mentioned gas plasma.

The etching apparatus of the present disclosure includes: a treatment container provided with a stage configured to carry a substrate including a silicon oxide film; a hydrogen fluoride gas supplier configured to supply a treatment gas including a hydrogen fluoride into the treatment container; an organic amine compound gas supplier configured to supply a treatment gas including an organic amine compound into the treatment container; a vacuum evacuator configured to reduce the pressure inside the treatment container; and a heater configured to heat the stage.

Advantageous Effects of Invention

The dry-etching method of the present disclosure enables etching of silicon oxide in a non-plasma state at a sufficient speed while generating no residue even at a low temperature of 200° C. or lower.

The etching apparatus of the present disclosure having the above-mentioned structure can etch silicon oxide in a non-plasma state while generating no residue by: introducing a hydrogen fluoride gas and an organic amine compound via the hydrogen fluoride gas supplier and the organic amine compound gas supplier, respectively, into the treatment container provided with a substrate including silicon oxide;

controlling the pressure with the vacuum evacuator; and heating the substrate with the heater.

BRIEF DESCRIPTION OF DRAWINGS

FIG. 1 is a schematic diagram of the etching apparatus of the present disclosure used in examples and comparative examples.

DESCRIPTION OF EMBODIMENTS

The present disclosure is specifically described in detail below. The essential features described below are examples of embodiments of the present disclosure and are not limited to the specific descriptions. The present disclosure may be variously modified and enabled within the scope of the gist thereof.

The dry-etching method of the present disclosure includes reacting silicon oxide with any one of the following (A) to (C): (A) a gaseous hydrogen fluoride and a gaseous organic amine compound, (B) a gaseous hydrogen fluoride salt of an organic amine compound, and (C) a gaseous hydrogen fluoride, a gaseous organic amine compound, and a gaseous hydrogen fluoride salt of an organic amine compound in a non-plasma state.

Specific embodiments of the dry-etching method of the present disclosure may be classified into two embodiments. A first embodiment of the etching is conducted by supplying a treatment gas including a hydrogen fluoride and an organic amine compound to the etching apparatus. A second embodiment of the etching is conducted by separately supplying a treatment gas including an organic amine compound and a treatment gas including a hydrogen fluoride to the etching apparatus.

First Embodiment

In the first embodiment, a treatment gas (dry-etching gas) including a hydrogen fluoride and an organic amine compound is supplied to the etching apparatus so that the treatment gas makes contact with silicon oxide, thereby etching the silicon oxide.

When silicon oxide is made in contact with a treatment gas including a hydrogen fluoride and an organic amine compound, the silicon oxide chemically reacts with the hydrogen fluoride and the organic amine compound to be converted into a reaction product such as an organic amine salt of hexafluorosilicic acid. Immediately upon generation, the reaction product sublimates into a gas or is thermally decomposed into a gas. Thus, the silicon oxide is removed. Herein, the term "sublimation" may refer to conversion of a solid into a gas without thermal decomposition and conversion of a solid into a component of a gas through thermal decomposition.

The hydrogen fluoride gas and the organic amine compound gas may be separately supplied and mixed to form a treatment gas in the etching apparatus. Alternatively, the hydrogen fluoride and the organic amine compound may be preliminarily reacted with each other into a hydrogen fluoride salt of the organic amine, and then the salt may be supplied as a dry-etching gas into the etching apparatus. In the case of separately supplying the hydrogen fluoride gas and the organic amine compound gas and mixing them in the etching apparatus, a hydrogen fluoride salt of at least a portion of the organic amine is generated in the etching apparatus. In the etching apparatus, the three components, i.e., the gaseous hydrogen fluoride, the gaseous organic amine compound, and the gaseous hydrogen fluoride salt of the organic amine compound may make contact with the silicon oxide. Alternatively, only the gaseous hydrogen fluoride salt of the organic amine compound may make contact with the silicon oxide, or only the gaseous hydrogen fluoride and the gaseous organic amine compound may make contact with the silicon oxide.

In any option, an organic amine salt of hexafluorosilicic acid is generated as a result of the reaction with the silicon oxide.

The ratio of the organic amine compound to the hydrogen fluoride included in the treatment gas, as determined by dividing the number of moles of the organic amine compound by the number of moles of the hydrogen fluoride, is preferably 0.001 or higher but 100 or lower, more preferably 0.01 or higher but 10 or lower, particularly preferably 0.1 or higher but 5 or lower.

Examples of the organic amine compound include a compound represented by the following formula (1):

(1)

wherein N represents a nitrogen atom, $R^1$ represents a C1-C10 hydrocarbon group optionally having a ring, a heteroatom, or a halogen atom, and $R^2$ and $R^3$ each represent a hydrogen atom or a C1-C10 hydrocarbon group optionally having a ring, a heteroatom, or a halogen atom, provided that: the hydrocarbon group, when it has a carbon number of three or more, may have a branched chain structure or a ring structure; the heteroatom in the hydrocarbon group is a nitrogen atom, an oxygen atom, a sulfur atom, or a phosphorus atom; $R^1$ and $R_2$, when both of them are hydrocarbon groups having a carbon number of one or more, may be directly bonded to each other to form a ring structure; $R^1$ and $R^2$, when they are directly bonded to each other via a double bond to form a ring structure, they may form an aromatic ring in the absence of $R^3$; and $R^1$, $R^2$, and $R^3$ may be hydrocarbon groups which are the same as or different from one another.

Examples of $R^1$ include a methyl group, an ethyl group, a propyl group, and a butyl group. Hydrogen atoms in the organic groups may be partially replaced by a halogen atom such as fluorine or chlorine. Examples of each of $R^2$ and $R^3$ include a hydrogen atom, a methyl group, an ethyl group, a propyl group, and a butyl group. Hydrogen atoms in the organic groups may be all or partially replaced by a halogen atom such as fluorine or chlorine. The organic amine compound represented by the formula (1) may be a heterocyclic amine having a five-membered ring structure or a six-membered ring structure.

Specific examples of the organic amine compound include monomethylamine, dimethylamine, trimethylamine, dimethylethylamine, diethylmethylamine, monoethylamine, diethylamine, triethylamine, mono-normal propylamine, di-normal propylamine, monoisopropylamine, diisopropylamine, monobutylamine, dibutylamine, mono-tertiary butylamine, di-tertiary butylamine, pyrrolidine, piperidine, piperazine, pyridine, and pyrazine. Specific examples also include the foregoing compounds in which all or part of C—H bonds are replaced by C—F bonds, such as trifluoromethylamine, 1,1,1-trifluorodimethylamine, perfluorodimethylamine, 2,2,2-trifluoroethylamine, perfluoroethylamine, bis(2,2,2-trifluoroethyl)amine, perfluorodiethylamine, and 3-fluoropyridine. These organic amine compounds are preferred because they each have a conjugated acid having a pKa of not lower than 3.2, which is the pKa of HF, and thus can form a salt with a hydrogen fluoride, have a constant vapor pressure in a temperature range from 20° C. to 100° C., and can be supplied as gas without decomposition in the temperature range.

In terms of easy availability, the organic amine compound is preferably monomethylamine, dimethylamine, trimethylamine, monoethylamine, monopropylamine, isopropylamine, 1,1,1-trifluorodimethylamine, 2,2,2-trifluoroethylamine, or bis(2,2,2-trifluoroethyl)amine.

To etch the silicon oxide faster, the organic amine compound is preferably a secondary amine or a tertiary amine. Specific examples of the secondary amine include dimethylamine, diethylamine, di-normal propylamine, diisopropylamine, dibutylamine, and di-tertiary butylamine. Specific examples of the tertiary amine include trimethylamine, dimethylethylamine, diethylmethylamine, and triethylamine.

The treatment gas may substantially consist only of the hydrogen fluoride and the organic amine compound. The treatment gas may optionally include an inert gas. Examples of the inert gas include noble gas such as argon gas, and nitrogen gas. The proportion of the inert gas in the treatment gas, as determined by dividing the number of moles of the inert gas by the number of moles of the hydrogen fluoride, is preferably 0 or higher but 100 or lower, more preferably 10 or lower, particularly preferably 5 or lower.

The treatment gas makes contact with the silicon oxide at not lower than a temperature at which a reaction product of the silicon oxide, the hydrogen fluoride, and the organic amine compound is sublimated or thermally decomposed. Taking productivity or damage of a substrate to be treated into consideration, the contact temperature is preferably 200° C. or lower, more preferably 150° C. or lower, particularly preferably 120° C. or lower. The contact temperature is preferably 20° C. or higher, more preferably 50° C. or higher, particularly preferably 80° C. or higher.

The treatment gas makes contact with the silicon oxide at any pressure. Yet, the pressure is preferably 0.1 Pa or higher but 100 kPa or lower, more preferably 0.5 Pa or higher but 50 kPa or lower, particularly preferably 1 Pa or higher but 10 kPa or lower.

The temperature and pressure during the contact between the treatment gas and the silicon oxide are each not necessarily constant and may be changed at certain intervals. For example, the temperature may be increased or the pressure may be reduced in a time period to facilitate the sublimation of the reaction product.

This embodiment may include a COR step of contacting the treatment gas with the silicon oxide and a PHT step of sublimating a reaction product without supplying the treatment gas as disclosed in Patent Literature 5. In such an embodiment, the PHT step may be conducted at 200° C. or lower.

The silicon oxide may be a silicon oxide film on a semiconductor substrate. The semiconductor substrate is usually a silicon substrate. A film other than a silicon oxide film, such as a silicon film, a silicon nitride film, or a metal film, may be exposed to the surface of the semiconductor substrate.

For a substrate to be treated where both a silicon oxide film and a silicon nitride film are exposed, the etching method of this embodiment enables selective etching of the silicon oxide film relative to the silicon nitride film. The silicon oxide/silicon nitride etching selection ratio is preferably 2.5 or higher, more preferably 5 or higher, still more preferably 8 or higher, particularly preferably 10 or higher. Herein, the term "silicon oxide/silicon nitride etching selection ratio" refers to a quotient of a division of the etching speed of the silicon oxide film by the etching speed of the silicon nitride film. Herein, the term "etching speed" refers to a quotient of a division of a change in the thickness of the film between before and after the etching by the duration of the etching. Thus, a higher silicon oxide/silicon nitride etching selection ratio means that the silicon oxide is etched at a higher rate than the silicon nitride.

The dry-etching method of the present disclosure can be used to selectively dry-etch $SiO_2$ in a structure in where $SiO_2$ is adjacent to SiN in production of a semiconductor device on a semiconductor substrate. Examples of the structure include a structure in which a SiN film covers a $SiO_2$ film and a structure in which a $SiO_2$ film and a SiN film are sequentially stacked. In an exemplary process of producing a three-dimensional memory, a $SiO_2$/SiN multilayer film is formed on a semiconductor substrate, a through hole is formed in the multilayer film, and an etching gas is supplied via the through hole to selectively etch the $SiO_2$ while allowing the SiN to remain by the dry-etching method of the present disclosure. Thus, a semiconductor device including a large number of parallel SiN layers with spaces therebetween can be produced.

The method of producing a semiconductor device of the present disclosure may be applied to not only production of the above-described semiconductor device but also production of a semiconductor device involving etching of a silicon oxide film formed on a substrate.

Second Embodiment

The etching in the second embodiment of the dry-etching method of the present disclosure is conducted by separately supplying a treatment gas including an organic amine compound and a treatment gas including a hydrogen fluoride into an etching apparatus. Specifically, in the second embodiment, a treatment gas including an organic amine compound is supplied to silicon oxide in an etching apparatus, followed by optional evacuation, and then a treatment gas including a hydrogen fluoride is supplied to the etching apparatus.

Examples of the organic amine compound include the compounds represented by the formula (1) for the first embodiment.

Presumably, when an organic amine is firstly introduced into an etching apparatus so that silicon oxide makes contact with the gaseous organic amine compound, the organic amine compound is adsorbed to the surface of the silicon oxide. The subsequent introduction of a gaseous hydrogen fluoride into the etching apparatus allows the hydrogen fluoride to make contact with the silicon oxide with the organic amine compound adsorbed thereto. Thus, the adsorbed organic amine compound is presumably converted into a reaction product such as an organic amine salt of hexafluorosilicic acid. The final reaction product is an organic amine salt of hexafluorosilicic acid that is of the same kind of the reaction product in the first embodiment. The compound is sublimated into a gas immediately upon generation or thermally decomposed into a gas.

The gas to be introduced into the etching apparatus may substantially consist only of the organic amine or substantially only of the hydrogen fluoride. The organic amine and the hydrogen fluoride each may optionally include an inert gas. Examples of the inert gas include noble gas such as argon gas, and nitrogen gas. The proportion of the inert gas in the treatment gas, as determined by dividing the number of moles of the inert gas by the number of moles of the hydrogen fluoride or the number of moles of the organic amine, is preferably 0 or higher but 100 or lower, more preferably 10 or lower, particularly preferably 5 or lower.

In supplying each treatment gas to the silicon oxide, the organic amine compound is made in contact with the silicon oxide at preferably 200° C. or lower, more preferably 150° C. or lower, particularly preferably 120° C. or lower. The hydrogen fluoride is made in contact with the silicon oxide at preferably 200° C. or lower, more preferably 150° C. or lower, particularly preferably 120° C. or lower. Each compound is made in contact with the silicon oxide at, for example, preferably 20° C. or higher, more preferably 50° C. or higher, particularly preferably 80° C. or higher. The contact temperature for the organic amine compound and the silicon oxide may be the same as or different from that for the hydrogen fluoride and the silicon oxide.

The organic amine compound or the hydrogen fluoride is made in contact with the silicon oxide at preferably 0.1 Pa or higher but 100 kPa or lower, more preferably 0.5 Pa or higher but 50 kPa or lower, particularly preferably 1 Pa or higher but 10 kPa or lower.

The structure of the silicon oxide as an etching target is preferably the same as the structure in the first embodiment. The etching method of the second embodiment enables selective etching of the silicon oxide film relative to the silicon nitride film. The silicon oxide/silicon nitride etching selection ratio is preferably 2.5 or higher, more preferably 5 or higher, particularly preferably 10 or higher.

The supply of the treatment gas including the organic amine compound may be conducted after the supply of the treatment gas including the hydrogen fluoride gas. The treatment gas including the hydrogen fluoride gas and the treatment gas including the organic amine compound may sequentially be alternately supplied.

[Etching Apparatus]

The etching methods of the embodiments are conducted using an etching apparatus including: a treatment container provided with a stage configured to carry a substrate to be treated including a silicon oxide film; a hydrogen fluoride gas supplier configured to supply a treatment gas including a hydrogen fluoride into the treatment container; an organic amine compound gas supplier configured to supply a treatment gas containing an organic amine compound into the treatment container; a vacuum evacuator configured to reduce the pressure inside the treatment container; and a heater configured to heat the stage. The etching apparatus may further include an inert gas supplier configured to supply an inert gas into the treatment container, if necessary.

FIG. 1 is a schematic diagram of a reactor 1 that is one example of the etching apparatus according to an embodiment of the present disclosure.

The reactor 1 includes a chamber (treatment container) 2 in which a stage 3 to be heated by a heater 8 is provided. Other heaters (not shown) are provided around the chamber 2 to heat a chamber wall. A treatment gas is introduced through a hydrogen fluoride gas supplier 5a and an organic amine compound gas supplier 5b which are provided on the upper part of the chamber so that the treatment gas makes contact with a sample (substrate to be treated) 4 carried on the stage 3. The gas in the chamber 2 is emitted through a gas emission line 6. The chamber 2 includes an inert gas supplier 5c through which an inert gas is optionally supplied. The gas emission line is connected to a vacuum pump (vacuum evacuator, not shown) configured to reduce the pressure in the chamber 2. The chamber 2 includes a manometer 7. An organic amine hydrogen fluoride salt gas supplier may be provided instead of the hydrogen fluoride gas supplier 5a and the organic amine compound gas supplier 5b.

The operation to remove silicon oxide in a sample 4 (substrate including a silicon oxide film) in the embodiments is briefly described below.

The stage 3 is heated to a predetermined temperature by the heater 8. Then, a treatment gas is introduced into the chamber 2 through the hydrogen fluoride gas supplier 5a and the organic amine compound gas supplier 5b under the conditions according to the first embodiment or the second embodiment so that the sample 4 makes contact with the treatment gas. A reaction product generated by the reaction is sublimated immediately upon generation and emitted from the chamber 2 through the gas emission line 6.

The reactor 1 further includes a regulator. The regulator may be a computer, for example, including a program, a memory, and a CPU. The program includes steps to work a series of operations in the first embodiment or the second embodiment. According to the program, the temperature of the sample 4, open-close of a valve in each gas supplier, the flow rate of each gas, and the pressure inside the chamber 2 are controlled. The program is saved in a computer storage medium such as a compact disc, a hard disc, a magneto-optical disc, or a memory card and is installed in the regulator.

Effects of Embodiments

The first embodiment of the dry-etching method or the second embodiment of the dry-etching method enables etching of silicon oxide without plasma even at a low temperature of 200° C. or lower.

In the first embodiment of the dry-etching method or the second embodiment of the dry-etching method, the etching can be conducted without leaving a residue of the formation of a reaction product layer on the surface of the silicon oxide even at a low temperature of 200° C. or lower. Thus, the silicon oxide can be etched in one step without a PHT treatment to sublimate the reaction product. Hence, the silicon oxide can be more efficiently etched than in a cycle etching in which a COR treatment and a PHT treatment are alternately conducted.

In the first embodiment of the dry-etching method or the second embodiment of the dry-etching method, the silicon oxide can be etched by the method of the present disclosure even without heating a substrate to a high temperature of higher than 200° C. Such a method can be applied to substrates including materials with low heat resistance.

The first embodiment of the dry-etching method or the second embodiment of the dry-etching method enables selective etching of the silicon oxide relative to polycrystalline silicon. In the etching methods of the embodiments, an organic amine compound is used so that silicon oxide can be etched at a higher silicon oxide/silicon nitride etching selection ratio than in conventional methods using ammonia. In the etching methods of the embodiments, the silicon oxide can be etched faster than in methods using water or alcohol.

EXAMPLES

Examples of the present disclosure and comparative examples are presented below, but the present disclosure is not limited to the examples.

A reactor illustrated in FIG. 1 was used in the examples and comparative examples. As the sample 4, a silicon wafer A including a polycrystalline silicon film, a silicon wafer B including a thermal oxide film, or a silicon wafer C including a silicon nitride film was used.

Examples 1-1 to 1-11, Comparative Examples 1-1 to 1-8

The wafer A, B, or C was placed on a stage in the chamber. The chamber was evacuated, and the temperature of the stage was adjusted to a predetermined temperature indicated in Table 1-1 below. Then, a treatment gas was supplied into the chamber, and the state was maintained for 30 seconds. Subsequently, the atmosphere in the chamber was evacuated to 10 Pa or lower and then replaced with an inert gas. Next, the wafer A, B, or C was taken out, and its thickness was measured, thereby evaluating the etching amount. Separately, a surface of the thermal oxide film on the silicon wafer B after the etching was observed with an optical microscope to examine the presence of residues on the surface.

Table 1-1 shows the types and flow rates of organic amines, flow rate of HF, pressure, temperature, and duration of etching, and Table 1-2 shows evaluation results after etching.

In Example 1-1, HF gas and trimethylamine gas were simultaneously introduced from different inlets into the chamber, and a gas mixture of the gases prepared in the chamber was made in contact with the sample. In Example 1-2, a gas prepared by gasifying trimethylamine hydrofluoride (NMe$_3$·HF) was supplied as the treatment gas into the chamber. In Examples 1-3, 1-4, and 1-8 and Comparative Example 1-1, dimethylamine, diethylamine, monomethylamine, and ammonia, respectively, were used instead of the trimethylamine in Example 1-1. In Comparative Example 1-2, ammonium fluoride (NH$_4$F) was used instead of the trimethylamine hydrofluoride in Example 1-2. Examples 1-5 to 1-7 and 1-9 and Comparative Example 1-3 were conducted at different temperatures. In Examples 1-10 and 1-11, the flow rates of the trimethylamine and the HF gas were changed from the flow rates in Example 1-1. In Comparative Examples 1-4 and 1-5, only HF diluted with argon gas and only trimethylamine diluted with argon gas, respectively, were supplied. In Comparative Examples 1-6, 1-7, and 1-8, gases prepared by gasifying water, methanol, and isopropyl alcohol, respectively, were supplied instead of the trimethylamine in Example 1-1.

TABLE 1-1

| | | Etching conditions | | | | | |
|---|---|---|---|---|---|---|---|
| | Organic amine, etc. | | HF | Ar | | | |
| | Type | Flow rate [sccm] | flow rate [sccm] | flow rate [sccm] | Pressure [Torr] | Temperature [° C.] | Duration [sec] |
| Example 1-1 | Trimethylamine | 50 | 50 | 0 | 30 | 100 | 30 |
| Example 1-2 | Trimethylamine hydrofluoride | 50 | 0 | 50 | 10 | 100 | 30 |
| Example 1-3 | Dimethylamine | 50 | 50 | 0 | 30 | 100 | 30 |
| Example 1-4 | Diethylamine | 50 | 50 | 0 | 30 | 100 | 30 |
| Example 1-5 | Trimethylamine | 50 | 50 | 0 | 30 | 60 | 30 |
| Example 1-6 | Dimethylamine | 50 | 50 | 0 | 30 | 60 | 30 |
| Example 1-7 | Diethylamine | 50 | 50 | 0 | 30 | 60 | 30 |
| Example 1-8 | Monomethylamine | 50 | 50 | 0 | 30 | 100 | 30 |
| Example 1-9 | Monomethylamine | 50 | 50 | 0 | 30 | 60 | 30 |
| Example 1-10 | Trimethylamine | 75 | 25 | 0 | 30 | 100 | 30 |
| Example 1-11 | Trimethylamine | 25 | 75 | 0 | 30 | 100 | 30 |
| Comparative Example 1-1 | Ammonia | 50 | 50 | 0 | 30 | 100 | 30 |
| Comparative Example 1-2 | Ammonium fluoride | 50 | 0 | 50 | 10 | 100 | 30 |
| Comparative Example 1-3 | Ammonia | 50 | 50 | 0 | 30 | 60 | 30 |
| Comparative Example 1-4 | Not added | 0 | 50 | 50 | 10 | 100 | 30 |
| Comparative Example 1-5 | Trimethylamine | 50 | 0 | 50 | 30 | 100 | 30 |
| Comparative Example 1-6 | Water | 10 | 50 | 40 | 30 | 100 | 30 |
| Comparative Example 1-7 | Methanol | 10 | 50 | 40 | 30 | 100 | 30 |
| Comparative Example 1-8 | Isopropyl alcohol | 10 | 50 | 40 | 30 | 100 | 30 |

TABLE 1-2

| | Evaluation result after etching | | | | |
|---|---|---|---|---|---|
| | p-Si etching amount [nm] | SiO$_2$ etching amount [nm] | SiN etching amount [nm] | SiO$_2$/SiN selection ratio | Presence of residue |
| Example 1-1 | <1 | 98 | 9 | 10.9 | No |
| Example 1-2 | <1 | 30 | 2 | 15.0 | No |
| Example 1-3 | <1 | 96 | 7 | 13.7 | No |
| Example 1-4 | <1 | 86 | 7 | 12.3 | No |
| Example 1-5 | <1 | 38 | 14 | 2.7 | No |
| Example 1-6 | <1 | 38 | 10 | 3.8 | No |
| Example 1-7 | <1 | 34 | 11 | 3.1 | No |
| Example 1-8 | <1 | 39 | 6 | 6.5 | No |
| Example 1-9 | <1 | 24 | 8 | 3.0 | No |
| Example 1-10 | <1 | 120 | 13 | 9.1 | No |
| Example 1-11 | <1 | 83 | 5 | 17.1 | No |

TABLE 1-2-continued

|  | Evaluation result after etching | | | | |
|---|---|---|---|---|---|
|  | p-Si etching amount [nm] | $SiO_2$ etching amount [nm] | SiN etching amount [nm] | $SiO_2$/SiN selection ratio | Presence of residue |
| Comparative Example 1-1 | <1 | 31 | 17 | 1.8 | Yes |
| Comparative Example 1-2 | <1 | 21 | 16 | 1.3 | Yes |
| Comparative Example 1-3 | <1 | 22 | 19 | 1.2 | Yes |
| Comparative Example 1-4 | <1 | 3 | 5 | 0.6 | No |
| Comparative Example 1-5 | <1 | <1 | <1 | — | No |
| Comparative Example 1-6 | <1 | 2 | 16 | 0.1 | No |
| Comparative Example 1-7 | <1 | 5 | 13 | 0.4 | No |
| Comparative Example 1-8 | <1 | 11 | 12 | 0.9 | No |

In Examples 1-1 to 1-11, the silicon oxide was etched, and no residue remained on the surface of the thermal oxide film on the wafer B. In Comparative Examples 1-1 to 1-3, residues remained. X-ray photoelectron spectroscopy (XPS) of the residues on the surfaces of the thermal oxide films in Comparative Examples 1-1 to 1-3 detected ammonium fluoride ($NH_4F$), ammonium hydrogen fluoride ($NH_4F \cdot HF$), or ammonium hexafluorosilicate (($NH_4)_2SiF_6$).

Specifically, trimethylamine hydrofluoride ($NMe_3 \cdot HF$) or $(HNMe_3)_2SiF_6$ that was a reaction product of trimethylamine, HF, and silicon oxide in Examples 1-1, 1-2, 1-5, 1-10, or 1-11 had a high vapor pressure and was sufficiently removed even at a temperature of 60° C. or 100° C. Moreover, a reaction product of dimethylamine, HF, and silicon oxide and a reaction product of diethylamine, HF, and silicon oxide had a higher vapor pressure than ammonium hexafluorosilicate. Such reaction products in Examples 1-3, 1-4, 1-5, and 1-6 were also sufficiently removed even at a temperature of 60° C. or 100° C. In contrast, ammonium hexafluorosilicate in Comparative Examples 1-1 to 1-3 had a low vapor pressure and was not sufficiently removed at a temperature of 60° C. or 100° C. Consequently, residues of ammonium hexafluorosilicate and the like remained on the surface of the thermal oxide film on the wafer. Meanwhile, if heat treatment at a temperature of higher than 200° C. is conducted after the contact with the treatment gas in Comparative Examples 1-1 to 1-3, residues remaining on the surface of the thermal oxide film in the wafer can be removed.

In Examples 1-8 and 1-9, the results demonstrate that the silicon oxide was etched with no residue even when monomethylamine was used. Comparison of the silicon oxide-etching speeds among Examples 1-1, 1-3, 1-5, 1-6, 1-8, and 1-9 and Comparative Examples 1-1 and 1-3 at the same temperature reveals that the speed with monomethylamine which is a primary amine is higher than the speed with ammonia but is lower than the speed with dimethylamine which is a secondary amine or the speed with trimethylamine which is a tertiary amine.

In Comparative Example 1-4 in which only HF was contacted, the silicon oxide-etching speed was lower, and the silicon oxide/silicon nitride etching selection ratio ($SiO_2$/SiN selection ratio) was low. In Comparative Example 5 in which only the organic amine compound was contacted, none of the polycrystalline silicon, the silicon oxide, and the silicon nitride was etched. In Comparative Examples 1-6, 1-7, and 1-8 in which water, methanol, and isopropyl alcohol, respectively, were used together with HF gas, the $SiO_2$-etching speed was low, and the $SiO_2$/SiN selection ratio was low.

Comparisons at the same temperature between Examples 1-1 to 1-4 and Comparative Examples 1-1 and 1-2 and between Examples 1-5 to 1-7 and Comparative Example 1-3 revealed that the $SiO_2$-etching speed was higher and the $SiO_2$/SiN selection ratio was higher in the examples than in the comparative examples. Moreover, in Examples 1-1 to 1-4, 1-10, and 1-11 in which the contact with the treatment gas was conducted at 100° C., the $SiO_2$/SiN selection ratio exceeded 8.

Examples 2-1 to 2-3, Comparative Examples 2-1 and 2-2

Etching evaluation was conducted by a method involving supplying an organic amine compound first and then supplying HF gas.

The wafer A, B, or C was placed on a stage in the chamber. The chamber was evacuated to 10 Pa or lower, and the temperature of the stage was adjusted to a predetermined temperature indicated in Table 2. Then, a treatment gas including amine was supplied into the chamber, and the pressure was maintained at 30 Torr (4 kPa) for 30 seconds. The chamber was evacuated to 0.1 kPa, and a treatment gas including HF gas was supplied into the chamber. The state at a pressure of 30 Torr (4 kPa) was maintained for 30 seconds. Subsequently, the atmosphere in the chamber was evacuated to 10 Pa or lower and then replaced with an inert gas. Next, the wafer A, B, or C was taken out, and its thickness was measured, thereby evaluating the etching amount. Separately, a surface of the thermal oxide film on the silicon wafer B after the etching was observed with an optical microscope to examine the presence of residues on the surface.

Table 2 shows the types and temperatures of amines and evaluation results after etching.

In Comparative Example 2-2, only a treatment gas including HF gas was supplied without supplying amine.

TABLE 2

| | Etching conditions | | Evaluation result after etching | | | | |
|---|---|---|---|---|---|---|---|
| | Organic amine, etc. Type | Temperature [° C.] | p-Si etching amount [nm] | SiO2 etching amount [nm] | SiN etching amount [nm] | SiO2/SiN selection ratio | Presence of residue |
| Example 2-1 | Trimethylamine | 100 | <1 | 99 | 9 | 11.0 | No |
| Example 2-2 | Dimethylamine | 100 | <1 | 85 | 28 | 3.0 | No |
| Example 2-3 | Monomethylamine | 100 | <1 | 38 | 14 | 2.7 | No |

TABLE 2-continued

|  | Etching conditions | | Evaluation result after etching | | | | |
|---|---|---|---|---|---|---|---|
|  | Organic amine, etc. Type | Temperature [° C.] | p-Si etching amount [nm] | SiO2 etching amount [nm] | SIN etching amount [nm] | SiO2/SiN selection ratio | Presence of residue |
| Comparative Example 2-1 | Ammonia | 100 | <1 | 32 | 17 | 1.9 | Yes |
| Comparative Example 2-2 | Not added | 100 | <1 | 3 | 5 | 0.6 | No |

As demonstrated in Examples 2-1 to 2-3, when a treatment gas including a hydrogen fluoride was supplied after supplying a treatment gas including an organic amine compound, the silicon oxide was etched with no residue.

The silicon oxide-etching speeds in Examples 2-1 to 2-3 were higher than in Comparative Example 2-1 in which ammonia was used. The silicon oxide-etching speed with dimethylamine which is a secondary amine or trimethylamine which is a tertiary amine was higher than the speed with monomethylamine which is a primary amine. In particular, with trimethylamine which is a tertiary amine, the SiO$_2$/SiN selection ratio exceeded 10.

REFERENCE SIGNS LIST

1 reactor (etching apparatus)
2 chamber (treatment container)
3 stage
4 sample (substrate to be treated)
5a hydrogen fluoride gas supplier
5b organic amine compound gas supplier
5c inert gas supplier
6 gas emission line
7 manometer
8 heater

The invention claimed is:

1. A method of dry-etching silicon oxide, comprising:
contacting silicon oxide with a treatment gas comprising any one of the following (a) to (c):
(a) a hydrogen fluoride and an organic amine compound,
(b) a hydrogen fluoride salt of an organic amine compound, and
(c) a hydrogen fluoride, an organic amine compound, and a hydrogen fluoride salt of an organic amine compound,
in a non-plasma state,
wherein a reaction product of the reaction sublimates into a gas as soon as it is generated, so that the silicon oxide is removed, and
the organic amine compound is a secondary amine or a tertiary amine.

2. The method of dry-etching silicon oxide according to claim 1,
wherein a temperature of the silicon oxide upon the reaction is 200° C. or lower.

3. The method of dry-etching silicon oxide according to claim 2,
wherein a temperature of the silicon oxide upon the reaction is 50° C. or higher and 200° C. or lower.

4. The method of dry-etching silicon oxide according to claim 1,
wherein a ratio of the organic amine compound to the hydrogen fluoride included in the treatment gas, as determined by dividing the number of moles of the organic amine compound by the number of moles of the hydrogen fluoride, is 0.001 or higher but 100 or lower.

5. The method of dry-etching silicon oxide according to claim 1,
wherein the organic amine compound is represented by the following formula (1):

(1)

wherein N represents a nitrogen atom, R$^1$ and R$^2$ each represent a C1-C10 hydrocarbon group optionally having a ring, a heteroatom, or a halogen atom, and represents a hydrogen atom or a C1-C10 hydrocarbon group optionally having a ring, a heteroatom, or a halogen atom, provided that: the hydrocarbon group, when it has a carbon number of three or more, optionally has a branched chain structure or a ring structure; the heteroatom in the hydrocarbon group is a nitrogen atom, an oxygen atom, a sulfur atom, or a phosphorus atom; R$^1$ and R$^2$, when both of them are hydrocarbon groups having a carbon number of one or more, are optionally directly bonded to each other to form a ring structure; R' and R$^2$, when they are directly bonded to each other via a double bond to form a ring structure, they optionally form an aromatic ring in the absence of R$^3$; and R$^1$, R$^2$, and R$^3$ are optionally hydrocarbon groups which are the same as or different from one another.

6. The method of dry-etching silicon oxide according to claim 1,
wherein the secondary amine is at least one compound selected from the group consisting of dimethylamine, diethylamine, di-normal propylamine, diisopropylamine, dibutylamine, and di-tertiary butylamine.

7. The method of dry-etching silicon oxide according to claim 1,
wherein the tertiary amine is at least one compound selected from the group consisting of trimethylamine, dimethylethylamine, diethylmethylamine, and triethylamine.

8. The method of dry-etching silicon oxide according to claim 1, further comprising selectively etching a silicon oxide film on a substrate to be treated where both the silicon oxide film and a silicon nitride film are exposed.

9. The method of dry-etching silicon oxide according to claim 8,
wherein a selection ratio of the silicon oxide film to the silicon nitride film is 2.5 or higher.

10. The method of dry-etching silicon oxide according to claim 1, further comprising selectively etching a silicon oxide film on a substrate to be treated where both the silicon oxide film and a polycrystalline silicon film are exposed.

11. A method of producing a semiconductor device, comprising
etching a silicon oxide film on a semiconductor substrate including the silicon oxide film using the method of dry-etching silicon oxide according to claim 1.

12. A method of dry-etching silicon oxide, comprising:
selectively etching a silicon oxide film on a substrate to be treated where both the silicon oxide film and a silicon nitride film are exposed,
wherein the selectively etching comprises contacting the silicon oxide film and the silicon nitride film with a treatment gas comprising any one of the following (a) to (c):
(a) a hydrogen fluoride and an organic amine compound,
(b) a hydrogen fluoride salt of an organic amine compound, and
(c) a hydrogen fluoride, an organic amine compound, and a hydrogen fluoride salt of an organic amine compound,
to obtain a reaction in a non-plasma state,
wherein the treatment gas does not comprise isopropyl alcohol, and
a reaction product of the reaction sublimates into a gas as soon as it is generated, so that the silicon oxide is removed.

13. The method of dry-etching silicon oxide according to claim 12, wherein a temperature of the silicon oxide upon the reaction is 50° C. or higher.

* * * * *